United States Patent
Morlang et al.

(10) Patent No.: US 9,990,252 B1
(45) Date of Patent: Jun. 5, 2018

(54) DATA STORAGE SYSTEM PERFORMANCE MANAGEMENT

(71) Applicant: Acronis International GmBh, Shaffhausen (CH)

(72) Inventors: Alexey Morlang, Moscow Region (RU); Alexey Andreev, Moscow (RU); Andrey Neporada, Moscow Region (RU); Serguei Beloussov, Costa Del Sol (SG)

(73) Assignee: ACRONIS INTERNATIONAL GMBH, Shaffhausen (CH)

( * ) Notice: Subject to any disclaimer, the term of this patent is extended or adjusted under 35 U.S.C. 154(b) by 0 days. days.

(21) Appl. No.: 14/959,474

(22) Filed: Dec. 4, 2015

Related U.S. Application Data (60) Provisional application No. 62/097,960, filed on Dec. 30, 2014.

(51) Int. Cl.
*G06F 11/10* (2006.01)
*H03M 13/15* (2006.01)

(52) U.S. Cl.
CPC ....... *G06F 11/1076* (2013.01); *H03M 13/154* (2013.01)

(58) Field of Classification Search
CPC .................................................. G06F 11/1076
USPC .............................. 714/764, 766, 776, 32, 15
See application file for complete search history.

(56) References Cited

U.S. PATENT DOCUMENTS

| | | | |
|---|---|---|---|
| 7,047,380 B2 | 5/2006 | Tormasov et al. |
| 7,246,211 B1 | 7/2007 | Beloussov et al. |
| 7,275,139 B1 | 9/2007 | Tormasov et al. |
| 7,281,104 B1 | 10/2007 | Tsypliaev et al. |
| 7,318,135 B1 | 1/2008 | Tormasov et al. |
| 7,353,355 B1 | 4/2008 | Tormasov et al. |
| 7,366,859 B2 | 4/2008 | Per et al. |
| 7,475,282 B2 | 1/2009 | Tormasov et al. |
| 7,603,533 B1 | 10/2009 | Tsypliaev et al. |
| 7,636,824 B1 | 12/2009 | Tormasov |
| 7,650,473 B1 | 1/2010 | Tormasov et al. |
| 7,721,138 B1 | 5/2010 | Lyadvinsky et al. |
| 7,779,221 B1 | 8/2010 | Tormasov et al. |
| 7,831,789 B1 | 11/2010 | Tsypliaev et al. |
| 7,886,120 B1 | 2/2011 | Tormasov |
| 7,895,403 B1 | 2/2011 | Tormasov et al. |
| 7,934,064 B1 | 4/2011 | Per et al. |
| 7,937,612 B1 | 5/2011 | Tormasov et al. |
| 7,949,635 B1 | 5/2011 | Korshunov et al. |

(Continued)

*Primary Examiner* — Fritz Alphonse
(74) *Attorney, Agent, or Firm* — K & L Gates, LLP (57) ABSTRACT

In part, the disclosure relates to a computer-implemented system for managing a data storage system comprising a plurality of data storage nodes. The system includes at least one processor and an operatively associated storage device. The at least one processor is programmed to: monitor utilization of at least one data object stored at the data storage system as a coded data object comprising a first total number of data blocks, wherein each of the first number of data blocks is stored at a separate data storage node, and wherein an original data object is re-creatable from a first base number of data blocks selected from the first total number of data blocks; determine that the utilization of the at least one data object has changed; and modify a number of the plurality of data storage nodes that store data blocks of the coded data object.

14 Claims, 8 Drawing Sheets

(56) References Cited

U.S. PATENT DOCUMENTS

| | | | |
|---|---|---|---|
| 7,953,948 | B1 | 5/2011 | Dyatlov et al. |
| 7,979,690 | B1 | 7/2011 | Dyatlov et al. |
| 8,005,797 | B1 | 8/2011 | Chepel et al. |
| 8,051,044 | B1 | 11/2011 | Dyatlov et al. |
| 8,069,320 | B1 | 11/2011 | Per et al. |
| 8,073,815 | B1 | 12/2011 | Korshunov et al. |
| 8,074,035 | B1 | 12/2011 | Per et al. |
| 8,145,607 | B1 | 3/2012 | Korshunov et al. |
| 8,180,984 | B1 | 5/2012 | Per et al. |
| 8,225,133 | B1 | 7/2012 | Tormasov et al. |
| 8,261,035 | B1 | 9/2012 | Tormasov et al. |
| 8,296,264 | B1 | 10/2012 | Dyatlov et al. |
| 8,312,259 | B1 | 11/2012 | Dyatlov et al. |
| 8,347,137 | B1 | 1/2013 | Chepel et al. |
| 8,380,757 | B1 * | 2/2013 | Bailey ............... G06F 17/30289 707/803 |
| 8,484,427 | B1 | 7/2013 | Lyadvinsky et al. |
| 8,645,748 | B1 | 2/2014 | Chepel et al. |
| 8,732,121 | B1 | 5/2014 | Zorin et al. |
| 8,856,927 | B1 | 10/2014 | Beloussov et al. |
| 8,996,830 | B1 | 3/2015 | Lyadvinsky et al. |
| 9,305,056 | B1 * | 4/2016 | Gupta ................. G06F 17/3048 |
| 2006/0225065 | A1 | 10/2006 | Chandhok et al. |
| 2008/0147821 | A1 * | 6/2008 | Dietrich ............ G06F 17/30206 709/216 |
| 2010/0011178 | A1 | 1/2010 | Feathergill |

* cited by examiner

DATA STORAGE SYSTEM PERFORMANCE MANAGEMENT

CROSS-REFERENCE TO RELATED APPLICATIONS

This application claims priority to and the benefit of U.S. provisional patent application No. 62/097,960, filed on Dec. 30, 2014, the disclosure of which is herein incorporated by reference in its entirety.

TECHNICAL FIELD

The technical field may generally relate to data storage and more particularly to performance management in data storage systems.

BACKGROUND

As data volume and broadband network speeds continue to increase, more and more computer users are turning to distributed data storage systems to satisfy their data storage needs. Distributed data storage systems include data storage hardware located at multiple nodes, where the nodes are often at different physical locations. Examples of distributed data storage systems include many popularly available cloud storage solutions for organizations and individuals.

In distributed storage systems, read time often an important measure of performance. Users expect to receive their data quickly. Some distributed storage systems increase data read time using hardware, such as disks or other data storage, network hardware, etc. Faster hardware on the storage side can lead to faster read times for users. Faster hardware, however, is typically also more expensive. Accordingly, many distributed storage system utilizing hardware tiering.

In some scenarios, hot data that is accessed frequently is stored using faster hardware. Warm data that is accessed less frequently is stored using slightly slower hardware. Cold data that is seldom accessed is stored using slower, less-expensive hardware. As hot data cools (e.g., is accessed less frequently), it is dynamically moved to slower hardware. This approach requires faster and more expensive hardware for storing hot data. It also requires careful hardware management. For example, if the volume of hot data increases, more fast hardware must be added to the system.

BRIEF SUMMARY

In part, the disclosure relates to computer-implemented system for managing the performance of a data storage system that includes a plurality of data storage nodes. In one embodiment, the system includes: at least one processor and an operatively associated storage device, wherein the at least one processor is programmed to: monitor utilization of at least one data object stored at the data storage system as a coded data object that includes a first total number of data blocks, wherein each of the first number of data blocks is stored at a separate data storage node selected from the plurality of data storage nodes, and wherein an original data object is recreatable from a first base number of data blocks selected from the first total number of data blocks; determine that the utilization of the at least one data object has changed; and modify a number of the plurality of data storage nodes that store data blocks of the coded data object.

In one embodiment, wherein modifying the number of the plurality of data storage nodes that store data blocks of the coded object includes: reading at least the first base number of data blocks selected from the first total number of data blocks; recreating the original data object from the read data blocks; dividing the original data object into a second base number of data blocks; encoding the second base number of data objects to generate a second coded data object that includes a second total number of data blocks; and storing each of the second total number of data blocks at a separate data storage node selected from the plurality of data storage nodes.

In one embodiment, wherein a ratio of the first base number of data blocks to the first total number of data blocks is equal to a ratio of the second base number of data blocks to the second total number of data objects.

In one embodiment, wherein a ratio of the first base number of data blocks to the first total number of data blocks is less than a ratio of the second base number of data blocks to the second total number of data objects.

In one embodiment, wherein modifying the number of the plurality of data storage nodes that store data blocks of the coded object includes: reading at least a portion of the first base number of data blocks; and writing each of the at least a portion of the first base number of data blocks to an additional data storage node.

In one embodiment, wherein determining that the utilization of the at least one data block has changed includes determining that the utilization of the at least one data block has increased, and wherein modifying the number of the plurality of storage nodes that store data blocks of the coded data object includes increasing the number of the plurality of storage nodes that store data blocks of the coded data object.

In one embodiment, wherein determining that the utilization of the at least one data block has changed includes determining that the utilization of the at least one data block has decreased, and wherein modifying the number of the plurality of storage nodes that store data blocks of the coded data object includes decreasing the number of the plurality of storage nodes that store data blocks of the coded data object.

In part, the disclosure relates to a computer-implemented system for managing the performance of a data storage system that includes a plurality of data storage nodes. In one embodiment, the system includes: at least one processor and an operatively associated storage device, wherein the at least one processor is programmed to: monitor utilization of a first data object stored at the data storage system as a coded data object that includes a first total number of data blocks, wherein each of the first number of data blocks is stored at a separate data storage node selected from the plurality of data storage nodes, and wherein an original data object is recreatable from a first base number of data blocks selected from the first total number of data blocks; monitor availability of the first data object stored at the data storage system; identify a mismatch between the utilization of a first data object and the availability of the first data object; and modify a number of the plurality of data storage nodes that store data blocks of the coded data object.

In one embodiment, wherein modifying the number of the plurality of data storage nodes that store data blocks of the coded object includes: reading at least the first base number of data blocks selected from the first total number of data blocks; recreating the original data object from the read data blocks; dividing the original data object into a second base number of data blocks; encoding the second base number of data objects to generate a second coded data object that includes a second total number of data blocks; and storing each of the second total number of data blocks at a separate data storage node selected from the plurality of data storage nodes. In one embodiment, wherein a ratio of the first base number of data blocks to the first total number of data blocks is equal to a ratio of the second base number of data blocks to the second total number of data objects.

In one embodiment, wherein a ratio of the first base number of data blocks to the first total number of data blocks is less than a ratio of the second base number of data blocks to the second total number of data objects. In one embodiment, wherein modifying the number of the plurality of data storage nodes that store data blocks of the coded object includes: reading at least a portion of the first base number of data blocks; and writing each of the at least a portion of the first base number of data blocks to an additional data storage node.

DESCRIPTION

Various examples are directed to systems and methods for managing the performance of a data storage system utilizing erasure coding. According to erasure coding, an original data object, such as a data file, database table, etc., is broken into data blocks, or base blocks. The number of base blocks (k) may be any suitable number. An erasure code algorithm is applied to the base blocks to generate a coded data object having n blocks, where n is any suitable number larger than k. Any suitable erasure code algorithm may be used including, for example, Reed-Solomon coding, maximum distance separable (MDS) codes, etc. The disclosure refers to the foregoing exemplary categories of erasure coding algorithms.

In addition to Reed-Solomon algorithm, many others can be used such as for example Tornado codes, Raptor codes, LT codes, and others code-based suitable algorithms. After erasure coding, the original data object may be recreated from any k of the n data blocks. The data object and coded data object may be described by at least three values. The total number of data blocks (n) describes the total number of data blocks in the coded data object. The number of base blocks (k) describes both the number of data blocks into which the original data object was broken into before coding and also the minimum number of data blocks from the coded data object that are necessary to recreate the original data object. A number of parity or remainder blocks (m) is the difference between the total number of data blocks in the coded data object (n) and the number of base blocks (k).

Erasure coding may be used in a distributed data storage system to provide space-efficient data redundancy for fault tolerance. For example, each data block in a coded data object may be stored at a separate node of the distributed data storage system. Because the original data object can be recreated from any k of the data blocks, a client device may be able to read the data object even if up to n-k of the distributed storage system nodes have failed or are otherwise unreachable by the client device. The degree of fault tolerance provided by erasure coding, then depends on the ratio of k to n.

In various examples, erasure coding may be modified to affect read times for data objects according to usage. For example, when each data block is stored at a separate node of the distributed data storage system, increasing the number of nodes may create additional points for parallel data access and corresponding increases in random read performance. In various examples, the total number of data blocks in a coded data object (e.g., n), and therefore, the total number of nodes used, may be increased by increasing the number of base blocks into which the original data object is broken during coding (e.g., k). In various examples, a distributed data storage system may monitor the utilization of stored data objects. More highly utilized data objects may be coded with a higher value for n.

Figure 1:
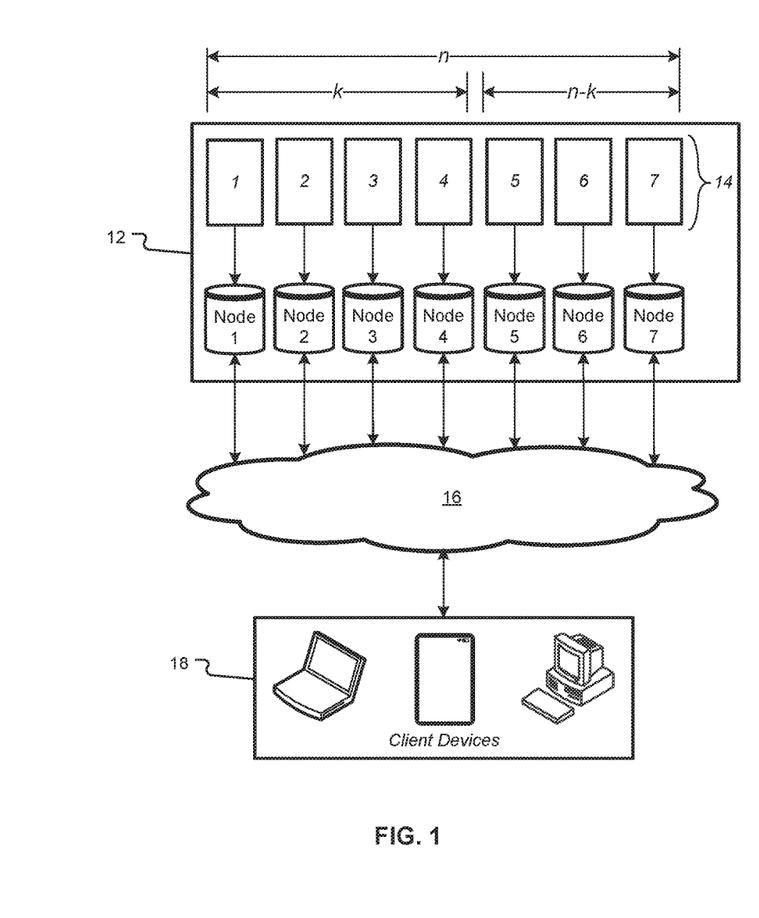
FIG. 1 is a diagram showing one example of an environment 10 comprising a distributed storage system storing a data object utilizing erasure codes.

FIG. 1 is a diagram showing one example of an environment 10 comprising a distributed storage system 12 storing a coded data object 14 utilizing erasure codes. The coded data object 14 is generated from an original data object utilizing erasure codes. Each data block of the coded data object 14 is stored on a separate node (e.g., Nodes 1-7) of a distributed data storage system 12. For example, in FIG. 1, the number of base blocks (k) is five and the total number of blocks (n) is seven. The ratio of k to n, then is 5 to 7. In the example shown in FIG. 1, each of the data blocks 1-7 is stored at separate nodes of the distributed storage system 12, labeled Node 1 through Node 7.

The coded data object 14 shown in FIG. 1 is just one example of applying erasure codes to a data object. For example, other coded data objects may have a different numbers of base blocks, different numbers of total blocks, and/or different numbers of overhead blocks. Also, for example, other data objects having five (5) base blocks may have different total numbers of blocks and/or different numbers of overhead blocks.

Each node, Node 1 through Node 7, may be in communication with one or more client devices 18 via a network 16. The network 16 may be any suitable wired or wireless network and, in some examples, may comprise the Internet. Client devices 18 may comprise any suitable computing device that stores and retrieves data including, for example, a server, a desktop computer, a laptop computer, a tablet computer, etc. To read the original data object, a client device 18 may read data blocks 1-7 from at least k (e.g., five) of the Nodes 1-7. The client device 18 may then recreate the original data object from the read data objects.

Figure 2:
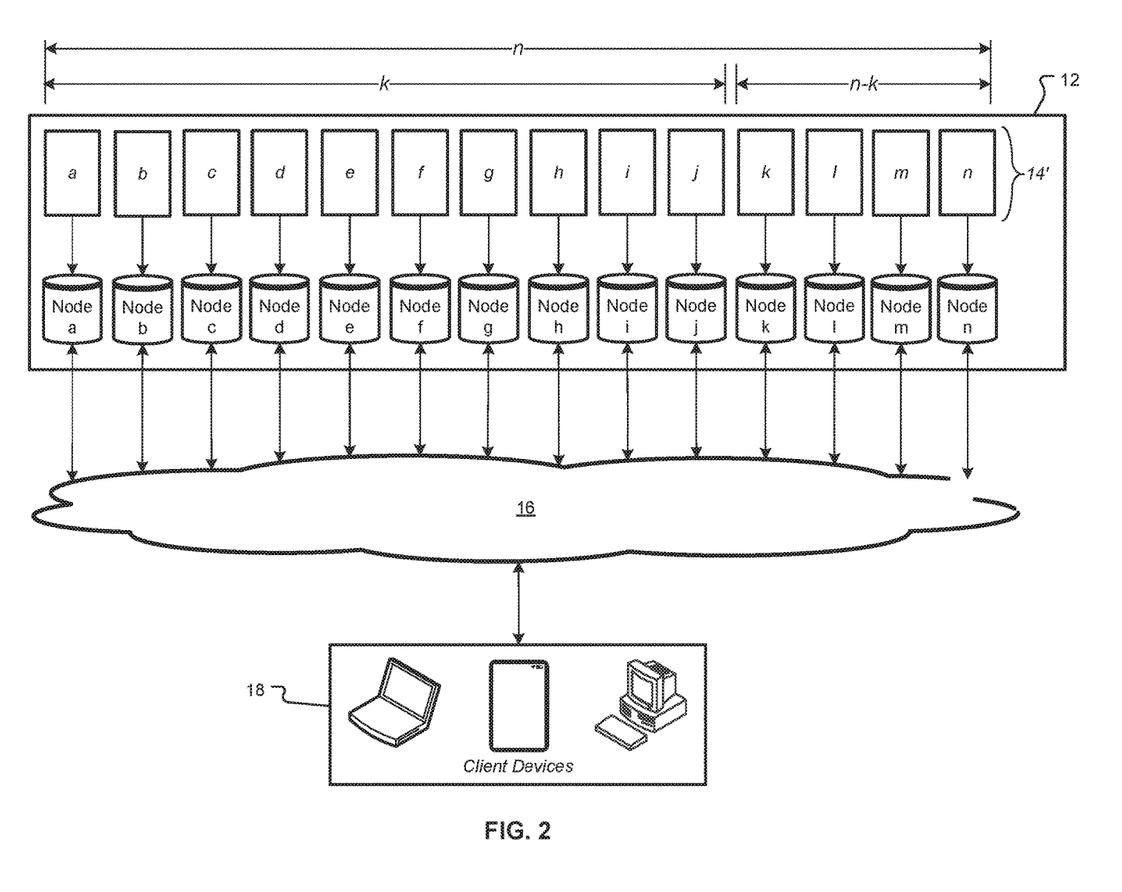
FIG. 2 is a diagram showing another example of the environment comprising the distributed storage system storing the data object utilizing a different number of nodes.

FIG. 2 is a diagram showing another example of the environment 10 comprising the distributed storage system 12 storing a coded data object 14' utilizing a different number of nodes. The coded data object 14' may be generated from the same original data object as the coded data object 14 shown in FIG. 1. In the example of FIG. 2, however, the number of base blocks (k) is 10, the total number of blocks (n) is 14 and the number of parity blocks (m or n-k) is 4.

Accordingly, the ratio of k to n is 5 to 7, the same as in FIG. 1. For example, to generate the configuration of FIG. 2, the original data object (not shown in FIG. 2) may have been divided into ten data blocks before the erasure coding algorithm was applied instead of five, as described with respect to FIG. 1. In FIG. 2, the fourteen data blocks of the coded data object 14' are indicated as data blocks a-n and are stored at Node a through Node n. In the example of FIG. 2, a client device 18 may recreate the original data object by reading any ten of the fourteen Nodes a-n.

Figure 3:
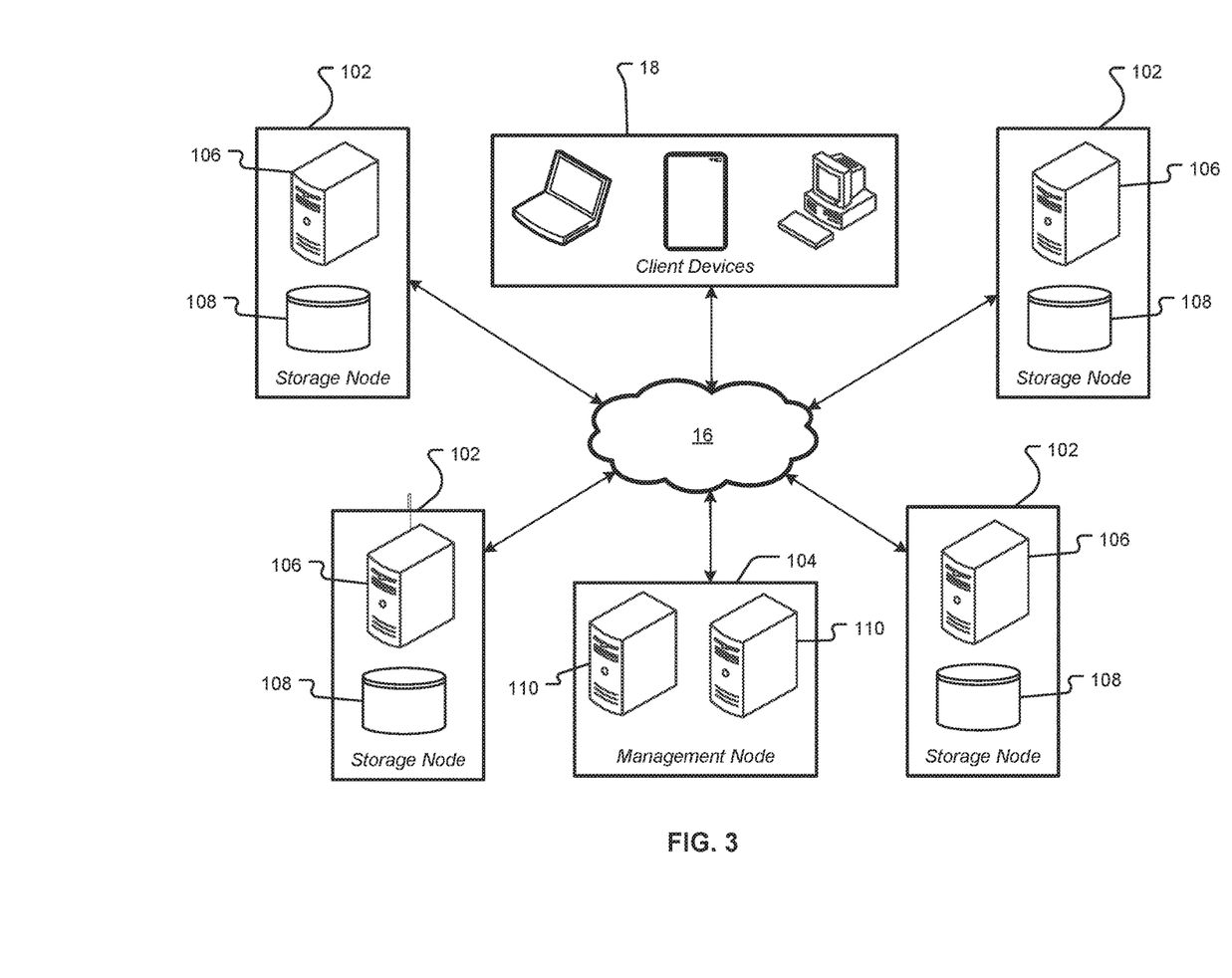
FIG. 3 is a diagram showing a hardware environment for implementing the data storage system.

FIG. 3 is a diagram showing a hardware environment 100 for implementing the data storage system 12. The environment 100 comprises data storage nodes 102, at least one management node 104 and client devices 18 communicating with one another via the network 16. Data storage nodes 102 may comprise one or more servers 106 or other suitable computing devices and one or more data storage devices 108. Each of the data storage nodes 102 may comprise a separate parallel connection to the network 16. Some data storage nodes 102 may be at the same physical location or, in some examples, the data storage nodes 102 may be distributed across multiple physical locations. Any suitable number of data storage nodes 102 may be used.

One or more management nodes 104 may manage data stored at the data storage nodes 102. The management node or nodes 104 may comprise one or more servers 110 or other suitable computing devices. Collectively, the data storage nodes 102 and management node or nodes 104 may make up a distributed data storage system, such as the distributed data storage system 12 described above. In some examples, the management node or nodes 104 may be omitted. For example, the functionality of the management node described herein may be performed by one or more of the individual data storage nodes 102.

Figure 4:
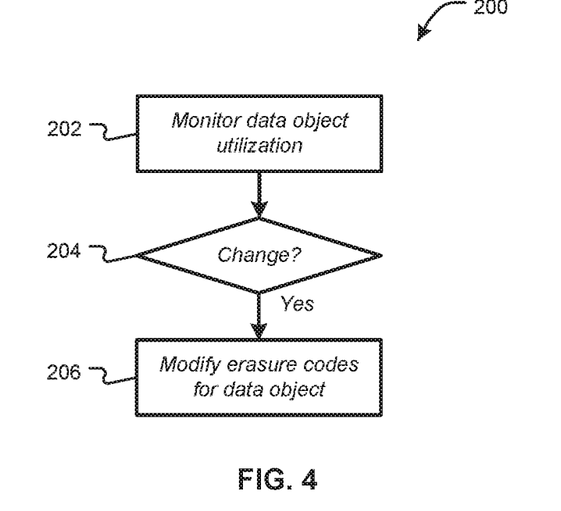
FIG. 4 is a flow chart showing one example of a process flow that may be executed by a management node to manage the performance of a distributed data storage system.

FIG. 4 is a flow chart showing one example of a process flow 200 that may be executed by a management node, such as the management node 104, to manage the performance of a distributed data storage system. At 202, the management node may monitor data object utilization. Data object utilization may be measured, for example, as an access frequency (e.g., the number of times that the data object is accessed over a given period of time). The management node may monitor the utilization of all or a subset of the data objects stored at the distributed storage system. At 204, the management node may determine if there has been a change in the utilization of one or more of the data objects.

For example, if the utilization of a data object has increased or decreased by more than a threshold amount, then the management node may determine that a change in utilization has occurred. In some examples, the management node may apply different thresholds for increases in utilization than for decreases. For example, if the utilization of the data object increases by an increase threshold, the management node may determine that a change has occurred, while if the utilization decreases by a decrease threshold, the management node may determine that a change has occurred. The increase and decrease thresholds may, but need not, be equal.

If the utilization of any data objects has changed, the management node may, at 206, modify the number of nodes storing the data object, for example, by modifying the erasure coding of the data object. For example, if the utilization of a data object has decreased, the management node may modify the erasure coding of the data object such that the corresponding coded data object has a smaller value for n (e.g., a smaller number of total data blocks). Accordingly, when each data block is stored at a separate node, the coded data object will be stored at a smaller number of nodes. This may decrease random read performance for the data object but also utilize fewer storage system resources.

Also, for example, if the utilization of a data object has increased, the management node may modify the erasure coding of the data object such that the corresponding coded data object has a larger value for n (e.g., more total data blocks). Accordingly, when each data block is stored at a separate node, the coded data object will be stored at a larger number of nodes. This may increase random read performance for the data object, but also utilize additional storage system resources.

Figure 5:
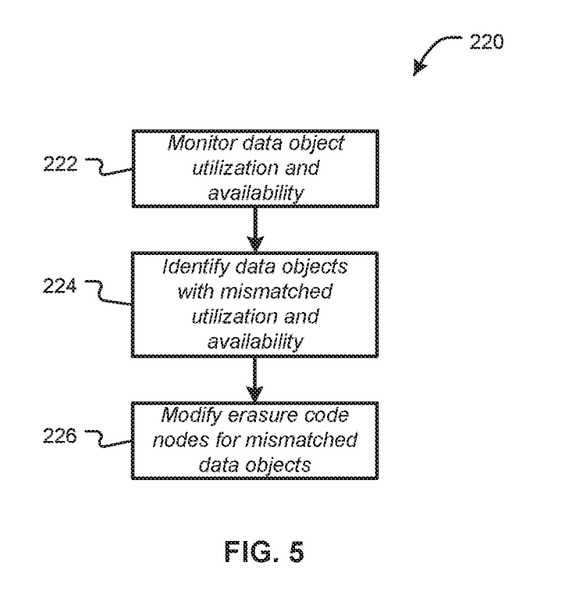
FIG. 5 is a flow chart showing another example of a process flow that may be executed by a management node to manage the performance of a distributed data storage system.

FIG. 5 is a flow chart showing another example of a process flow 220 that may be executed by a management node to manage the performance of a distributed data storage system. At 222, the management node may monitor the utilization and availability of data objects stored at the distributed data system. Availability may indicate the number of nodes at which a coded data object is available. In various examples, the availability of a coded data object is equal to n, as described above. At 224, the management node may identify one or more data objects having mismatched utilization and availability. Data objects with mismatched utilization and availability may utilize more nodes than their utilization would justify and/or utilize fewer nodes than their utilization would justify.

Mismatched utilization and availability may be determined, for example, based on one or more thresholds. For example, a mismatch may be determined if a ratio of utilization-to-availability exceeds a first threshold or falls below a second threshold. The first and second thresholds may take any suitable values. At 226, the management node may modify the number of nodes storing the data objects identified at 224, for example, by modifying their erasure coding. For example, data objects having a utilization-to-availability ratio exceeding first threshold may be modified to have a larger number of total data blocks (n), while data objects having a utilization-to-availability ratio less than the second threshold may be modified to have a smaller number of total data blocks (n).

Figure 6:
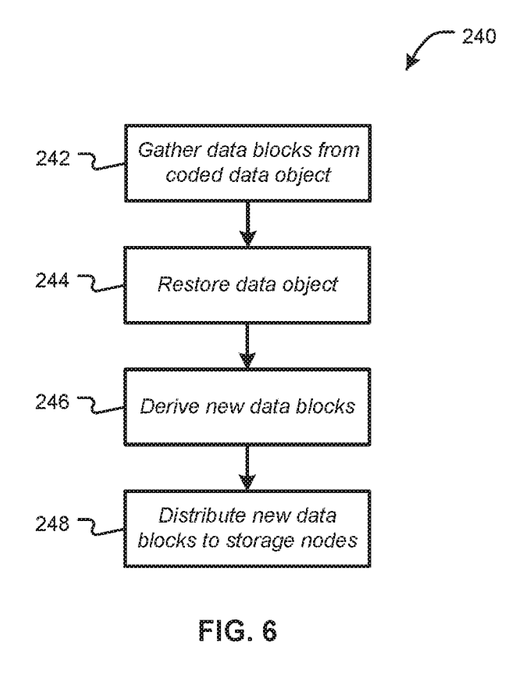
FIG. 6 is a flow chart showing one example of a process flow that may be executed by a management node to modify the erasure coding of a data object.

FIG. 6 is a flow chart showing one example of a process flow 240 that may be executed by a management node to modify the erasure coding of a data object, for example, as described above with respect to 206 and 226. At 242, the management node may gather the data blocks making up the coded data object. For example, referring to FIG. 1, the management node may gather any five of the data blocks 1-7, for example, by communicating with the nodes (Node 1-Node 7) at which the data blocks are stored. At 244, the management node may restore the data object. For example, the management node may derive the original data object from the read data blocks, as described herein. At 246, the management node may derive new data blocks.

For example, the management node may break the original data object into base data blocks, wherein the number of base data blocks is more or less than the number of base data blocks in the previous coded data object (e.g., depending on whether the read times for the data object are to be increased or decreased). A suitable erasure coding algorithm may be applied to generate a new coded data object comprising n data blocks. The total number of blocks (n) in the new coded data object may be more or less than the total number of data blocks in the original coded data object (e.g., depending on whether the read times for the data object are to be increased or decreased). At 248, the management node may distribute the newly generated data blocks to separate nodes of the distributed data storage system, as described herein. In some examples, the management node may maintain the same ratio of k to n.

The management node may be configured to increase (or decrease) n by any suitable increment. In some examples, the management node may be configured to double the total number of data blocks (n) when utilization exceeds the increase threshold and halve n when utilization is less than a decrease threshold. For example, the management node, at 246, may double the number of base data blocks (k) from what was used to generate the previous coded data object for the original data object. This may also double the total number of data blocks (n) and the number of remainder or parity blocks (e.g., n-k), while maintaining the ratio of k to n. In some examples, the management node may also modify the ratio of k to n. For example, in addition to or instead of increasing (or decreasing) the number of base blocks, the management node may increase (or decrease) the total number of data blocks (n) by increasing (or decreasing) number of parity blocks.

Figure 7:
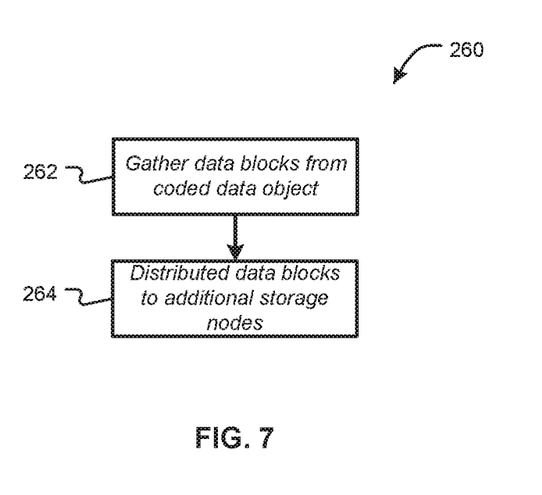
FIG. 7 is a flow chart showing one example of a process flow 260 that may be executed by a management node to increase the number of data storage nodes storing a coded data object without recoding the data object.

FIG. 7 is a flow chart showing one example of a process flow 260 that may be executed by a management node to increase the number of data storage nodes storing a coded data object without recoding the data object. For example, the process flow 260 may be executed to implement the actions described above with respect to 206 and 226 when an increase in the total number of data blocks is desired. At 262, the management node may gather data blocks from a coded data object, for example, as described herein with respect to 242. The management node may gather all (e.g., n) of the data blocks making up the coded data object, or merely a portion thereof. At 264, the management node may store at least a portion of the read data blocks to additional data storage nodes. In this way, client devices may have additional channels to access the data blocks.

Figure 8:
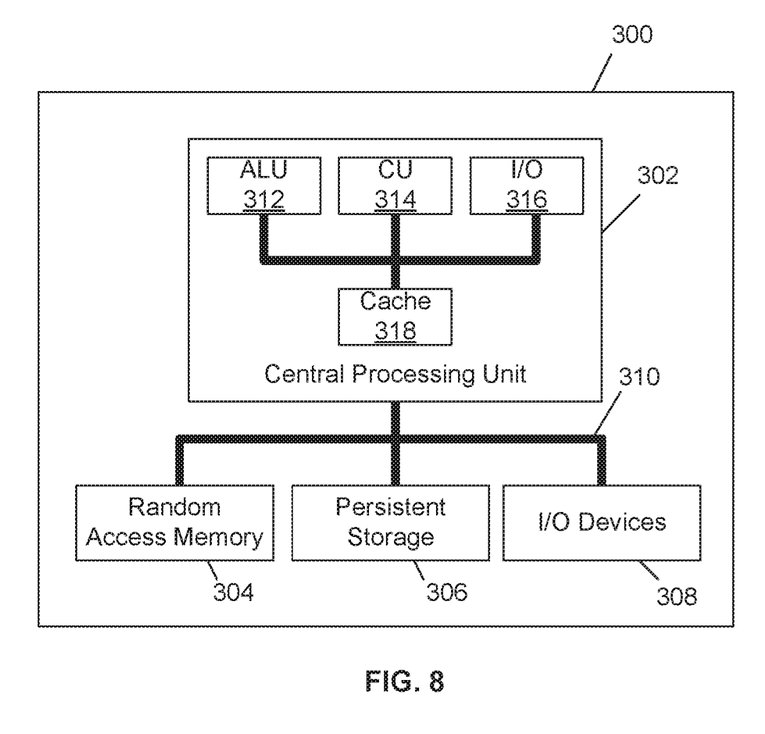
FIG. 8 is a block diagram showing one example of an implementing computing device.

FIG. 8 is a block diagram showing one example of an implementing computing device 600. For example, the computing device 600 is one example of a computing device that may implement the architecture 10 and/or execute the process flows 200, 220, 240, 260 described herein. The computer system 300 comprises a central processing unit (CPU) 302, a random access memory 306, and various input/output (I/O) devices 308. The various components 304, 306, 308 may be in communication with one another via one or more busses such as bus 310.

The CPU 302 may comprise an arithmetic and logic unit (ALU) 312, a control unit 314, cache memory 318, and an input and output I/O control 316. These components can be interconnected by a bus or busses 320, often comprising groups of wires or cables. The control unit 314, ALU 312 and basic I/O control (and sometimes other hardware closely linked with these sections) can be collectively considered the central processing unit (CPU) 302 for the computer system 300. The CPU 302 may be constructed on a single integrated circuit or microprocessor.

The control unit 314 (control system or central controller) may direct the various components of the computer system 300. For example, the control unit 314 may decode each instruction in a computer program and turn it into a series of control signals that operate other components of the computer system 300. To enhance performance or efficiency of operation, the control unit may, in some examples, alter the order of instructions. In some examples, the control unit 314 may comprise a program counter and a memory register that tracks the location in memory from which the next instruction is to be read.

The ALU 312 may be capable of performing arithmetic and logic operations. The set of arithmetic operations that a particular ALU 312 supports may be limited to adding and subtracting or might include multiplying or dividing, trigonometry functions (sine, cosine, etc.) and square roots. Some examples of the ALU 312 may be programmed to operate on whole numbers (integers), while others may use floating point representations of real numbers, for example. The ALU 312 may also compare numbers and return Boolean truth values (e.g., true or false).

Some examples of the system 300, such as those implementing superscalar computers, may contain multiple ALUs 312 to facilitate processing multiple instructions at the same time. For example, graphics processors and computers with Simple Instruction Multiple Data (SIMD) and/or Multiple Instruction Multiple Data (MIMD) features often possess ALU's 312 that can perform arithmetic operations on vectors and matrices. Some examples of the computer system 300 may include one or more RAM cache memories 318 configured to move more frequently needed data into the cache automatically.

Some examples described herein may comprise multiple CPU's 302. For example, functions may be divided between separate CPU's 302, creating a multiprocessing configuration. For example, multiprocessor and multi-core (multiple CPUs on a single integrated circuit) computer systems with co-processing capabilities may be employed. Also, multitasking may be employed as a computer processing technique to handle simultaneous execution of multiple computer programs.

Random access memory 304 may comprise any suitable type of memory including, for example, Dynamic Random Access Memory (DRAM), Double Data Rate Synchronous Dynamic Random Access Memory (DDR SDRAM). Persistent storage 306 may be similar to the storage devices 108 described above with respect to the architecture 10. For example, persistent storage may comprise any type of persistent storage device including, for example, a single fixed disk drive, an array of disk drives, an array of disk drives combined to provide the appearance of a larger, single disk drive, a solid state drive (SSD), a storage area network (SAN), etc. I/O devices 308 may, for example, be managed by the I/O control 316 and may include, for example, keyboards, mice, screen displays, monitors, printers, hard disk drives, floppy disk drives, joysticks, and image scanners.

A number of implementations have been described. Nevertheless, it will be understood that various modifications may be made without departing from the spirit and scope of the disclosure. For example, various forms of the flows shown above may be used, with steps re-ordered, added, or removed. Accordingly, other implementations are within the scope of the following claims.

In various examples, modules or software can be used to practice certain aspects of the invention. For example, software-as-a-service (SaaS) models or application service provider (ASP) models may be employed as software application delivery models to communicate software applications to clients or other users. Such software applications can be downloaded through an Internet connection, for example, and operated either independently (e.g., downloaded to a laptop or desktop computer system) or through a third-party service provider (e.g., accessed through a third-party web site). In addition, cloud computing techniques may be employed in connection with various examples of the invention. In certain examples, a "module" may include software, firmware, hardware, or any reasonable combination thereof.

Various examples of the systems and methods may include and/or utilize a computing device. In various examples, a computer may be in communication with a server or server system utilizing any suitable type of communication including, for example, wired or wireless digital communications. In some examples, the server or server system may be implemented as a cloud computing application and/or in a similar manner and may provide various functionality of the systems and methods as SaaS.

The examples presented herein are intended to illustrate potential and specific implementations of the present invention. The examples are intended primarily for purposes of illustration of the invention for those skilled in the art. No particular aspect or aspects of the examples are necessarily intended to limit the scope of the present invention The figures and descriptions of the present invention have been simplified to illustrate elements that are relevant for a clear understanding of the present invention, while eliminating, for purposes of clarity, other elements. Those of ordinary skill in the art may recognize, however, that these sorts of focused discussions would not facilitate a better understanding of the present invention, and therefore, a more detailed description of such elements is not provided herein.

The processes associated with the present examples may be executed by programmable equipment, such as computers. Software or other sets of instructions that may be employed to cause programmable equipment to execute the processes may be stored in any storage device, such as, for example, a computer system (non-volatile) memory, an optical disk, magnetic tape, or magnetic disk. Furthermore, some of the processes may be programmed when the computer system is manufactured or via a computer-readable memory medium.

It can also be appreciated that certain process aspects described herein may be performed using instructions stored on a computer-readable memory medium or media that direct a computer or computer system to perform process steps. A computer-readable medium may include, for example, memory devices such as diskettes, compact discs of both read-only and read/write varieties, optical disk drives, and hard disk drives. A computer-readable medium may also include memory storage that may be physical, virtual, permanent, temporary, semi-permanent and/or semi-temporary.

A "computer," "computer system," "component," "computing device," or "processor" may be, for example and without limitation, a processor, microcomputer, minicomputer, server, mainframe, laptop, personal data assistant (PDA), wireless e-mail device, cellular phone, pager, processor, fax machine, scanner, or any other programmable device configured to transmit and/or receive data over a network. Computer systems and computer-based devices disclosed herein may include memory for storing certain software applications used in obtaining, processing, and communicating information. It can be appreciated that such memory may be internal or external with respect to operation of the disclosed examples. The memory may also include any means for storing software, including a hard disk, an optical disk, floppy disk, ROM (read only memory), RAM (random access memory), PROM (programmable ROM), EEPROM (electrically erasable PROM) and/or other computer-readable memory media. In various examples, a "host," "engine," "loader," "filter," "agent," "platform," or "component" may include various computers or computer systems, or may include a reasonable combination of software, firmware, and/or hardware.

In various examples, a single component may be replaced by multiple components, and multiple components may be replaced by a single component, to perform a given function or functions. Except where such substitution would not be operative to practice examples, such substitution is within the scope of the present invention. Any of the computer systems described herein, for example, may be replaced by a "server farm" or other grouping of networked servers (e.g., a group of server blades) that are located and configured for cooperative functions. It can be appreciated that a server farm may serve to distribute workload between/among individual components of the farm and may expedite computing processes by harnessing the collective and cooperative power of multiple servers. Such server farms may employ load-balancing software that accomplishes tasks such as, for example, tracking demand for processing power from different machines, prioritizing and scheduling tasks based on network demand, and/or providing backup contingency in the event of component failure or reduction in operability.

In general, it may be apparent to one of ordinary skill in the art that various examples described herein, or components or parts thereof, may be implemented in many different examples of software, firmware, and/or hardware, or modules thereof. The software code or specialized control hardware used to implement some of the present examples is not limiting of the present invention. For example, the examples described hereinabove may be implemented in computer software using any suitable computer programming language such as .NET, SQL, My SQL, or HTML using, for example, conventional or object-oriented techniques. Programming languages for computer software and other computer-implemented instructions may be translated into machine language by a compiler or an assembler before execution and/or may be translated directly at run time by an interpreter.

Examples of assembly languages include ARM, MIPS, and x86; examples of high level languages include Ada, BASIC, C, C++, C#, COBOL, Fortran, Java, Lisp, Pascal, Object Pascal; and examples of scripting languages include Bourne script, JavaScript, Python, Ruby, PHP, and Perl. Various examples may be employed in a Lotus Notes environment, for example. Such software may be stored on any type of suitable computer-readable medium or media such as, for example, a magnetic or optical storage medium. Thus, the operation and behavior of the examples are described without specific reference to the actual software code or specialized hardware components. The absence of such specific references is feasible because it is clearly understood that artisans of ordinary skill would be able to design software and control hardware to implement the examples based on the description herein with only a reasonable effort and without undue experimentation.

Various examples of the systems and methods described herein may employ one or more electronic computer networks to promote communication among different components, transfer data, or to share resources and information. Such computer networks can be classified according to the hardware and software technology that is used to interconnect the devices in the network, such as optical fiber, Ethernet, wireless LAN, HomePNA, power line communication or G.hn. The computer networks may also be embodied as one or more of the following types of networks: local area network (LAN); metropolitan area network (MAN); wide area network (WAN); virtual private network (VPN);

storage area network (SAN); or global area network (GAN), among other network varieties.

For example, a WAN computer network may cover a broad area by linking communications across metropolitan, regional, or national boundaries. As the systems and methods described herein aim to minimize I/O transactions, they may be useful in situations, such as cloud computing configurations, where I/O transactions are performed over a WAN or other network with long I/O delays. The network may use routers and/or public communication links. One type of data communication network may cover a relatively broad geographic area (e.g., city-to-city or country-to-country) which uses transmission facilities provided by common carriers, such as telephone service providers.

In another example, a GAN computer network may support mobile communications across multiple wireless LANs or satellite networks. In another example, a VPN computer network may include links between nodes carried by open connections or virtual circuits in another network (e.g., the Internet) instead of by physical wires. The link-layer protocols of the VPN can be tunneled through the other network. One VPN application can promote secure communications through the Internet. The VPN can also be used to separately and securely conduct the traffic of different user communities over an underlying network. The VPN may provide users with the virtual experience of accessing the network through an IP address location other than the actual IP address which connects the access device to the network.

The computer network may be characterized based on functional relationships among the elements or components of the network, such as active networking, client-server, or peer-to-peer functional architecture. The computer network may be classified according to network topology, such as bus network, star network, ring network, mesh network, star-bus network, or hierarchical topology network, for example. The computer network may also be classified based on the method employed for data communication, such as digital and analog networks.

Examples of the methods, systems, and tools described herein may employ internetworking for connecting two or more distinct electronic computer networks or network segments through a common routing technology. The type of internetwork employed may depend on administration and/or participation in the internetwork. Non-limiting examples of internetworks include intranet, extranet, and Internet. Intranets and extranets may or may not have connections to the Internet. If connected to the Internet, the intranet or extranet may be protected with appropriate authentication technology or other security measures. As applied herein, an intranet can be a group of networks which employ Internet Protocol, web browsers and/or file transfer applications, under common control by an administrative entity. Such an administrative entity could restrict access to the intranet to only authorized users, for example, or another internal network of an organization or commercial entity. As applied herein, an extranet may include a network or internetwork generally limited to a primary organization or entity, but which also has limited connections to the networks of one or more other trusted organizations or entities (e.g., customers of an entity may be given access an intranet of the entity thereby creating an extranet).

Computer networks may include hardware elements to interconnect network nodes, such as network interface cards (NICs) or Ethernet cards, repeaters, bridges, hubs, switches, routers, and other like components. Such elements may be physically wired for communication and/or data connections may be provided with microwave links (e.g., IEEE 802.12) or fiber optics, for example. A network card, network adapter or NIC can be designed to allow computers to communicate over the computer network by providing physical access to a network and an addressing system through the use of MAC addresses, for example. A repeater can be embodied as an electronic device that receives and retransmits a communicated signal at a boosted power level to allow the signal to cover a telecommunication distance with reduced degradation. A network bridge can be configured to connect multiple network segments at the data link layer of a computer network while learning which addresses can be reached through which specific ports of the network. In the network, the bridge may associate a port with an address and then send traffic for that address only to that port. In various examples, local bridges may be employed to directly connect local area networks (LANs); remote bridges can be used to create a wide area network (WAN) link between LANs; and/or, wireless bridges can be used to connect LANs and/or to connect remote stations to LANs.

In various examples, a hub may be employed which contains multiple ports. For example, when a data packet arrives at one port of a hub, the packet can be copied unmodified to all ports of the hub for transmission. A network switch or other devices that forward and filter OSI layer 2 datagrams between ports based on MAC addresses in data packets can also be used. A switch can possess multiple ports, such that most of the network is connected directly to the switch, or another switch that is in turn connected to a switch. The term "switch" can also include routers and bridges, as well as other devices that distribute data traffic by application content (e.g., a Web URL identifier or other data location information as described herein). Switches may operate at one or more OSI model layers, including physical, data link, network, or transport (i.e., end-to-end). A device that operates simultaneously at more than one of these layers can be considered a multilayer switch. In certain examples, routers or other like networking devices may be used to forward data packets between networks using headers and forwarding tables to determine an optimum path through which to transmit the packets.

As employed herein, an application server may be a server that hosts an API to expose business logic and business processes for use by other applications. Examples of application servers include J2EE or Java EE 5 application servers including Web Sphere Application Server. Other examples include Web Sphere Application Server Community Edition (IBM), Sybase Enterprise Application Server (Sybase Inc.), WebLogic Server (BEA), JBoss (Red Hat), JRun (Adobe Systems), Apache Geronimo (Apache Software Foundation), Oracle OC4J (Oracle Corporation), Sun Java System Application Server (Sun Microsystems), and SAP Netweaver AS (ABAP/Java).

Also, application servers may be provided in accordance with the .NET framework, including the Windows Communication Foundation, .NET Remoting, ADO.NET, and ASP-.NET among several other components. For example, a Java Server Page (JSP) is a servlet that executes in a web container which is functionally equivalent to CGI scripts. JSPs can be used to create HTML pages by embedding references to the server logic within the page. The application servers may mainly serve web-based applications, while other servers can perform as session initiation protocol servers, for instance, or work with telephony networks. Specifications for enterprise application integration and service-oriented architecture can be designed to connect many different computer network elements. Such specifications include Business Application Programming Interface, Web Services Interoperability, and Java EE Connector Architecture.

In various examples, the computer systems, data storage media, or modules described herein may be configured and/or programmed to include one or more of the above-described electronic, computer-based elements and components, or computer architecture. In addition, these elements and components may be particularly configured to execute the various rules, algorithms, programs, processes, and method steps described herein.

Implementations of the present disclosure and all of the functional operations provided herein can be realized in digital electronic circuitry, or in computer software, firmware, or hardware, including the structures disclosed in this specification and their structural equivalents, or in combinations of one or more of them. Implementations of the disclosure can be realized as one or more computer program products, i.e., one or more modules of computer program instructions encoded on a computer readable medium for execution by, or to control the operation of, a data processing apparatus. The computer readable medium can be a machine-readable storage device, a machine readable storage substrate, a memory device, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this disclosure can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio player, a Global Positioning System (GPS) receiver, to name just a few. Computer readable media suitable for storing computer program instructions or computer program products and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. These may also be referred to as computer readable storage media. The processor and the memory can be supplemented by, or incorporated in, special purpose logic circuitry.

To provide for interaction with a user, implementations of described herein can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Implementations of the present disclosure can be realized in a computing system that includes a back end component, e.g., as a data server, or that includes a middleware component, e.g., an application server, or that includes a front end component, e.g., a client computer having a graphical user interface or a Web browser through which a user can interact with an implementation of the present disclosure, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

While this disclosure contains many specifics, these should not be construed as limitations on the scope of the disclosure or of what may be claimed, but rather as descriptions of features specific to particular implementations of the disclosure. Certain features that are described in this disclosure in the context of separate implementations can also be provided in combination in a single implementation. Conversely, various features that are described in the context of a single implementation can also be provided in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

While various examples have been described herein, it should be apparent, however, that various modifications, alterations and adaptations to those examples may occur to persons skilled in the art with the attainment of some or all of the advantages of the invention. The disclosed examples are therefore intended to include all such modifications, alterations and adaptations without departing from the scope and spirit of the invention. Accordingly, other examples and implementations are within the scope of the following claims. For example, the actions recited in the claims can be performed in a different order and still achieve desirable results.

What is claimed is:

1. A computer-implemented system for managing performance of a data storage system comprising a plurality of data storage nodes, the system comprising:
   at least one processor and
   an operatively associated storage device, wherein the at least one processor is programmed to:
      monitor utilization of at least one data object stored at the data storage system as a coded data object comprising a first total number of data blocks,
         wherein each of the first total number of data blocks is stored at a separate one or more data storage nodes selected from the plurality of data storage nodes, and
         wherein an original data object is recreatable from a first base number of data blocks selected from the first total number of data blocks;
      determine that the utilization of the at least one data object has changed; and
      modify a number of the plurality of data storage nodes that store data blocks of the coded data object.

2. The system of claim 1, wherein modifying the number of the plurality of data storage nodes that store data blocks of the coded object comprises:
   reading at least the first base number of data blocks selected from the first total number of data blocks;
   recreating the original data object from the read data blocks;
   dividing the original data object into a second base number of data blocks;
   encoding the second base number of data objects to generate a second coded data object comprising a second total number of data blocks; and
   storing each of the second total number of data blocks at one or more data storage nodes selected from the plurality of data storage nodes.

3. The system of claim 2, wherein a ratio of the first base number of data blocks to the first total number of data blocks is equal to a ratio of the second base number of data blocks to the second total number of data objects.

4. The system of claim 2, wherein a ratio of the first base number of data blocks to the first total number of data blocks is less than a ratio of the second base number of data blocks to the second total number of data objects.

5. The system of claim 1, wherein modifying the number of the plurality of data storage nodes that store data blocks of the coded object comprises:
   reading at least a portion of the first base number of data blocks; and
   writing each of the at least a portion of the first base number of data blocks to an additional data storage node.

6. The system of claim 1, wherein determining that the utilization of the at least one data object has changed comprises determining that the utilization of the at least one data object has increased, and wherein modifying the number of the plurality of storage nodes that store data blocks of the coded data object comprises increasing the number of the plurality of storage nodes that store data blocks of the coded data object.

7. The system of claim 1, wherein determining that the utilization of the at least one data object has changed comprises determining that the utilization of the at least one data object has decreased, and wherein modifying the number of the plurality of storage nodes that store data blocks of the coded data object comprises decreasing the number of the plurality of storage nodes that store data blocks of the coded data object.

8. A computer-implemented system for managing performance of a data storage system comprising a plurality of data storage nodes, the system comprising:
   at least one processor and
   an operatively associated storage device, wherein the at least one processor is programmed to:
      monitor utilization of a first data object stored at the data storage system as a coded data object comprising a first total number of data blocks,
         wherein each of the first total number of data blocks is stored at one or more data storage nodes selected from the plurality of data storage nodes, and
         wherein an original data object is recreatable from a first base number of data blocks selected from the first total number of data blocks;
      monitor availability of the first data object stored at the data storage system;
      identify a mismatch between the utilization of a data object and the availability of the data object; and
      modify a number of the plurality of data storage nodes that store data blocks of the coded data object.

9. The system of claim 8, wherein modifying the number of the plurality of data storage nodes that store data blocks of the coded object comprises:
   reading at least the first base number of data blocks selected from the first total number of data blocks;
   recreating the original data object from the read data blocks;
   dividing the original data object into a second base number of data blocks;
   encoding the second base number of data objects to generate a second coded data object comprising a second total number of data blocks; and
   storing each of the second total number of data blocks at one or more data storage nodes selected from the plurality of data storage nodes.

10. The system of claim 9, wherein a ratio of the first base number of data blocks to the first total number of data blocks is equal to a ratio of the second base number of data blocks to the second total number of data objects.

11. The system of claim 9, wherein a ratio of the first base number of data blocks to the first total number of data blocks is less than a ratio of the second base number of data blocks to the second total number of data objects.

12. The system of claim 8, wherein modifying the number of the plurality of data storage nodes that store data blocks of the coded object comprises:
   reading at least a portion of the first base number of data blocks; and
   writing each of the at least a portion of the first base number of data blocks to an additional data storage node.

13. The system of claim 8, wherein modifying the number of the plurality of data storage nodes that store data blocks of the coded object comprises:
decreasing the number of the plurality of storage nodes that store data blocks of the coded data object.

14. The system of claim 8, wherein modifying the number of the plurality of data storage nodes that store data blocks of the coded object comprises:
   increasing the number of the plurality of storage nodes that store data blocks of the coded data object.

\* \* \* \* \*